(12) United States Patent
Atriss et al.

(10) Patent No.: US 11,283,462 B2
(45) Date of Patent: Mar. 22, 2022

(54) SEMICONDUCTOR DEVICE AND RESISTANCE MEASUREMENT SYSTEM

(71) Applicant: RENESAS ELECTRONICS CORPORATION, Tokyo (JP)

(72) Inventors: Ahmad H. Atriss, Milpitas, CA (US); Masuo Okuda, Tokyo (JP); Stuart N. Wooters, Milpitas, CA (US)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 153 days.

(21) Appl. No.: 16/841,170

(22) Filed: Apr. 6, 2020

(65) Prior Publication Data

US 2021/0313999 A1 Oct. 7, 2021

(51) Int. Cl.
| | |
|---|---|
| *G01R 29/26* | (2006.01) |
| *H03M 1/80* | (2006.01) |
| *G01R 27/26* | (2006.01) |
| *H03M 1/78* | (2006.01) |
| *H03K 17/955* | (2006.01) |

(52) U.S. Cl.
CPC ........ *H03M 1/802* (2013.01); *G01R 27/2605* (2013.01); *H03M 1/785* (2013.01); *H03K 17/955* (2013.01)

(58) Field of Classification Search
CPC .. G01R 27/2605; H03M 1/785; H03M 1/802; H03K 17/955
See application file for complete search history.

(56) References Cited

U.S. PATENT DOCUMENTS

| | | |
|---|---|---|
| 9,109,959 B2 | 8/2015 | Nieddu et al. |
| 2018/0281708 A1 | 10/2018 | Garrard et al. |
| 2019/0204253 A1 | 7/2019 | Yoo et al. |

OTHER PUBLICATIONS

Extended European Search Report issued in corresponding European Patent Application No. 21164910.8-1001, dated Oct. 4, 2021.

*Primary Examiner* — Alesa Allgood
(74) *Attorney, Agent, or Firm* — McDermott Will & Emery LLP

(57) ABSTRACT

A semiconductor device includes first and second terminals, a reference resister being coupled between the first and second terminals, third and fourth terminals, a sensor resister being coupled between the third and fourth terminals, a first buffer which supplies a first reference voltage to the first terminal, a second buffer which supplies a second reference voltage to the fourth terminal, a reference voltage generation circuit which supplies one of first and second voltages alternately in a time division manner as the first reference voltage and supplies the other as the second reference voltage, a first analog-to-digital conversion circuit which performs analog-to-digital conversion on a signal line coupled to the third terminal, an RC filter disposed on the signal line, a noise detector which detects noise of the signal line, wherein a time constant of the RC filter is changed based on a result of the noise detector.

19 Claims, 17 Drawing Sheets

SEMICONDUCTOR DEVICE AND RESISTANCE MEASUREMENT SYSTEM

BACKGROUND

The present invention relates to a semiconductor device, for example, a semiconductor device and a resistance measuring system for converting a detection signal of a resistance value change type sensor into a digital value and outputting the digital value. The resistance value change type sensor detects a resistance change in a sense target.

THE BACKGROUND OF THE INVENTION

Thermistors are widely used as sensors for measuring temperature. The thermistor is one of resistive components whose resistance changes with temperature. One of the applications of such a thermistor is an automobile. In an automobile, an intake air temperature, an exhaust gas temperature, a temperature of an engine compartment, and the like are measured, and control according to the temperature is performed.

Patent Document 1 discloses one technique for measuring the resistivity of such thermistors. In the measuring circuit disclosed in Patent Document 1, a resistive component to be measured is connected in series with a pull-up resistor, a high potential side reference voltage Vp is applied to an upper end of the pull-up resistor, and a low potential side reference voltage Vn is applied to a lower end of the resistive component. Then, a PWM signal having a duty ratio corresponding to a voltage generated at a connection node between the pull-up resistor and the resistive component is generated. The resistance value of the resistive component is calculated based on the duty ratio of the PWM signal and the resistance value of the pull-up resistor.

PRIOR-ART DOCUMENT

Patent Document

[Patent Document 1] U.S. Pat. No. 9,109,959

SUMMARY

The thermistors disposed in the intake, exhaust, and engine compartment are connected to an ECU (Engine Control Unit) for measuring the resistances of the thermistors via wire harnesses. The ECU is equipped with a sensor IC and a microcontroller, and a signal of each thermistor is processed by the microcontroller through the sensor IC. In addition to the wire harness, a wire harness is also used in an ignition control line of a glow plug and an injector control line of an engine in an automobile. Since the plurality of wire harnesses are bundled, noise caused by the ignition control and the injection control is superimposed on the signal of the thermistor as EMI noise by the magnetic coupling. The EMI noise deteriorates the resistance measurement accuracy. As a countermeasure against noise, there is a method of using a twisted pair cable, but this leads to an increase in part cost and vehicle body weight.

Other objects and novel features will become apparent from the description of the specification and drawings.

A semiconductor device according to one embodiment comprises: a first terminal to which one end of a reference resistor is coupled; a second terminal to which the other end of the reference resistor is coupled; a third terminal to which the other end of the sensor resistor is coupled; a fourth terminal to which the other end of the sensor resistor is coupled; a first buffer for supplying a first reference voltage to the first terminal; a second buffer for supplying a second reference electric voltage to the fourth terminal; a reference voltage generation circuit which supplies one of first and second voltages alternately in a time division manner as the first reference voltage and supplies the other as the second reference voltage; a first analog-to-digital conversion circuit which performs analog-to-digital conversion on a signal line coupled to the third terminal; an RC filter disposed on the signal line; and a noise detector which detects noise on the signal line; wherein a time constant of the RC filter is changed based on a noise detection result of the noise detector.

In one embodiment of a semiconductor device, both the reduction of the sensor resistivity measurements time and the noise attenuation can be achieved.

DETAILED DESCRIPTION

Figure 1:
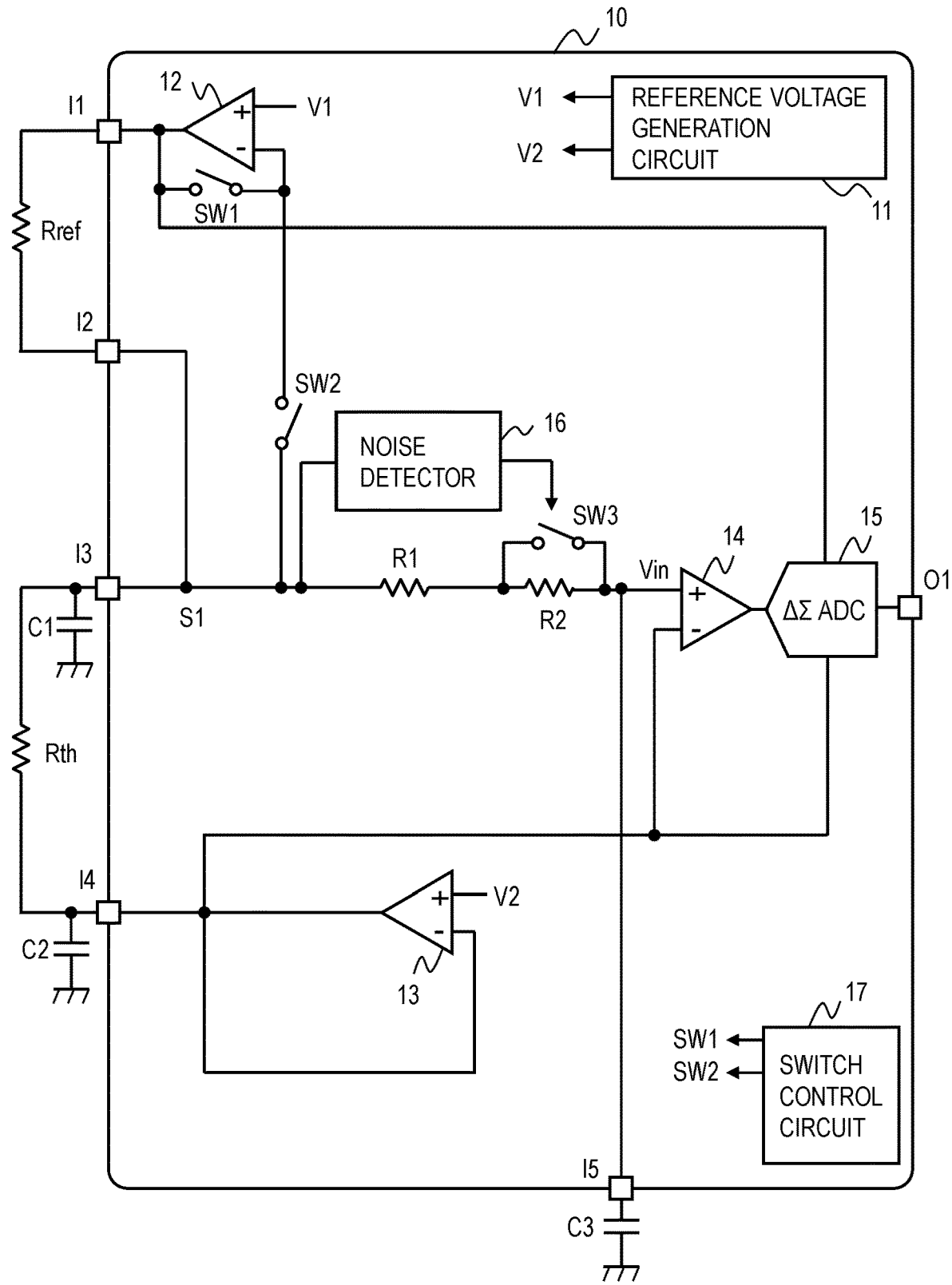
FIG. 1 is a schematic diagram of a semiconductor device according to a first embodiment.

Hereafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a semiconductor device 10 according to the first embodiment.

As shown in FIG. 1, the semiconductor device 10 has five input terminals I1 to I5 and an output terminal O1. A first resistor, reference resistor Rref, is coupled between terminals I1 and I2. The reference Rref is a resistive component having a known resistivity. A second resistor Rth is coupled between the terminals I3 and I4. The sensor resistor Rth is, for example, a resistive component whose resistance value changes in accordance with the surrounding environment, such as a thermistor. The semiconductor device 10 performs analog-to-digital conversion for calculating the resistance of the sensor resistor Rth, and outputs the conversion result from the output terminal O1. The capacitors C1 to C3 coupled to the third to fifth terminals are elements for reducing EMI noise.

Further, the semiconductor device 10 includes a reference voltage generating circuit 11, a first buffer (operational amplifier) 12, a second buffer (operational amplifier) 13, a pre-buffer (operational amplifier) 14, a first analog-to-digital converter (e.g., ΔΣ ADC) 15, a noise detector 16, a switch control circuit 17, a switch SW1~SW3, and resistors R1 and R2.

Figure 2:
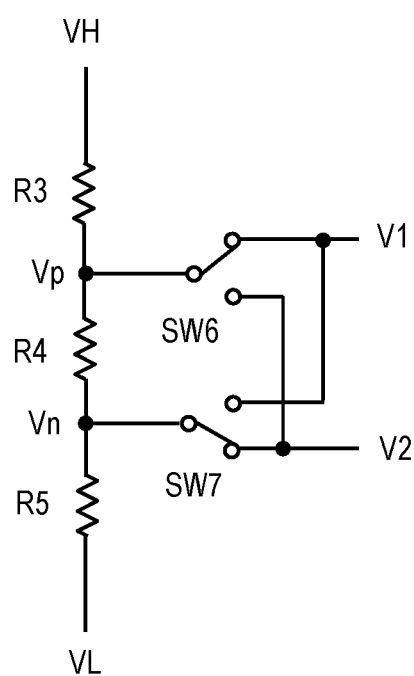
FIG. 2 illustrates an exemplary reference voltage generator.

The reference voltage generator 11 outputs both first and second reference voltages V1 and V2. The reference voltage V1, at times, is the high potential reference voltage Vp and alternatively is the low potential reference voltage Vn, which are selected in a time division manner. Among the high potential reference voltage Vp and the low potential reference voltage Vn, a voltage not selected as V1 is selected as V2. FIG. 2 shows an exemplary reference voltage generator 11. The voltage VH and the voltage VL (VH>VL) are divided by the resistors R3, R4, and R5 to obtain a high potential reference voltage Vp and a low potential reference voltage Vn. By switching the switches SW6 and SW7 by time division, (V1=Vp, V2=Vn) and (V1=Vn, V2=Vp) are alternately switched by time division.

Returning to FIG. 1, the configuration of the semiconductor device 10 will be further described. The operational amplifier 12 is connected to the terminal I1. The reference voltage V1 is supplied to the non-inverting terminal of the operational amplifier 12. The inverting terminal of the operational amplifier 12 is connected to the outputting terminal of the operational amplifier 12 via the switch SW1, and is connected to the terminal I3 via the switch SW2. The terminals I2 and I3 are short-circuited by the signal line S1.

The operational amplifier 13 is connected to the terminal I4. The reference voltage V2 is supplied to the non-inverting terminal of the operational amplifier 13. The output terminal of the operational amplifier 13 is connected to the inverting terminal of the operational amplifier 13.

The pre-buffer 14 is connected to the ΔΣ ADC 15. The non-inverting input of the pre-buffer 14 is connected to the terminal I3 via the resistors R1 and R2. The output terminal of the operational amplifier 13 is connected to the inverting terminal of the operational amplifier 14.

The ΔΣ ADC 15 performs analog-to-digital conversion on the output of the pre-buffer 14, and outputs the conversion result from the output terminal O1. The power supply voltage of the DAC in the ΔΣ ADC is supplied from operational amplifiers 12 and 13. Although the ΔΣ ADC is used as the analog-to-digital conversion circuit, the present invention is not limited thereto. It is also possible to use other types of analog-to-digital conversion circuits.

Figure 3:
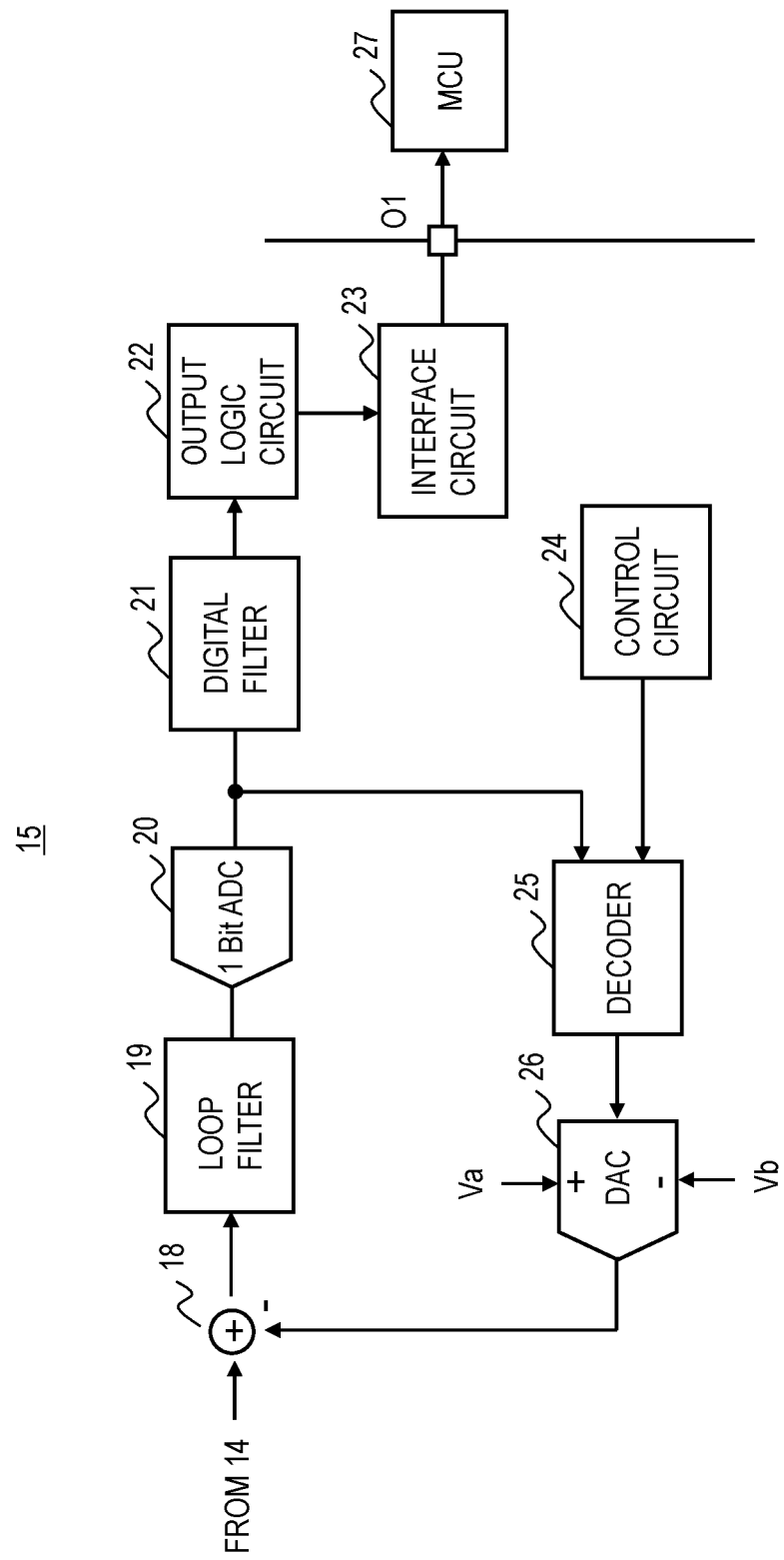
FIG. 3 is an example of a $\Delta\Sigma$ ADC.

FIG. 3 shows an example of the ΔΣ ADC 15. The ΔΣ ADC 15 includes a subtractor 18, a loop filter 19, a second ADC (1 Bit ADC) 20, a digital filter 21, an output-logic circuit 22, an interface circuit 23, a first control circuit 24, a decoder 25, and a digital-to-analog converter (DAC) 26. The reference voltage V1 is supplied to the positive reference voltage Va of DAC 26, and the reference voltage V2 is supplied to the negative reference voltage Vb. The 1-bit ADC 20 may be a multi-bit ADC. DAC 26 may be a multi-bit DAC.

Returning to FIG. 1 again. The resistors R1 and R2 together with the capacitor C3 constitute an RC filter to reduce EMI noise mixed into the terminal I3.

The noise detector 16 is coupled between the terminal I3 and the resistor R1. The noise detector 16 detects the presence or absence of noise in the signal inputted from the terminal I3, and controls the switch SW3 according to the detection result. Details will be described later.

The switch controller 17 controls the switches SW1 and SW2. Details will be described later.

Next, the operation of the semiconductor device 10 will be described. This first embodiment is characterized by the noise detector 16, the resistor R2, and the switch SW3, and prior to their explanation, the basic operation of the semiconductor device 10 will be explained.

Figure 4:
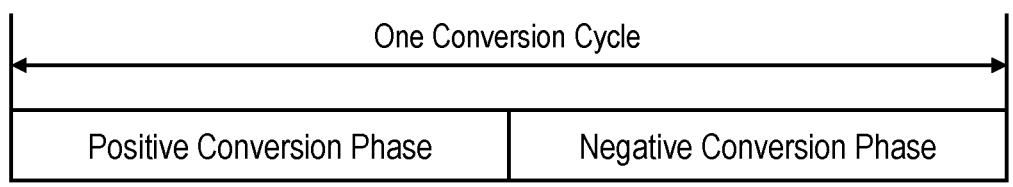
FIG. 4 is a diagram showing one conversion-cycle of the semiconductor device according to the first embodiment.

FIG. 4 is a diagram showing one conversion cycle of the semiconductor device 10. In the first embodiment, one analog-to-digital conversion consists of a positive conversion phase and a negative conversion phase. The positive conversion phase is an analog-to-digital conversion in which the high potential reference voltage Vp is selected as reference voltage V1 and the low potential reference voltage Vn is selected as reference voltage V2. The negative conversion phase is an analog-to-digital conversion in which the low potential reference voltage Vn is selected as the reference voltage V1 and the high potential reference voltage Vp is selected as the reference voltage V2.

In both the positive conversion phase and the negative conversion phase, the switch SW1 is turned on and the switches SW2, SW3 are turned off. The reference voltage V1 is supplied to the terminal I1 and the reference voltage V2 is supplied to the terminal I4 by the operational amplifiers 12 and 13. The non-inverting terminal of the pre-buffer 14 is supplied with a voltage Vtgt obtained by dividing the potential difference between the reference voltage V1 and V2 by the resistors Rref and Rth. Therefore, the pre-buffer 14 outputs a voltage corresponding to the difference between the voltage Vtgt and the reference voltage V2 to the ΔΣ ADC 15.

As described above, in the positive conversion phase, V1=Vp and V2=Vn. In the negative conversion phase, V1=Vn and V2=Vp. Therefore, the positive Vtgt is input to the ΔΣ ADC 15 in the positive conversion phase, and the negative Vtgt is input to the ΔΣ ADC 15 in the negative conversion phase.

Here, an offset voltage between the pre-buffer 14 and the ΔΣ ADC 15 will be considered. For example, suppose that the non-inverting terminal of the pre-buffer 14 has an offset voltage Voff1. It is also assumed that the ΔΣ ADC 15 also has an offset voltage Voff2. The output result Dpos of the ΔΣ ADC 15 in the positive conversion phase is the output result of the analog-to-digital conversion for Vtgt+Voff1+Voff2. The output result Dneg of the ΔΣ ADC 15 in the negative conversion phase is the output result of the analog-to-digital conversion for −Vtgt+Voff1+Voff2. Therefore, by calculating (Dpos−Dneg)/2 (Equation 1), the offset voltages Voff1 and Voff2 are canceled, and Vtgt can be obtained. Since Vtgt=(Rth/(Rth+Rref))*(Vp−Vn) (Equation 2), Rth can be obtained from the obtained Vtgt. Since Dpos and Dneg are digital values, Equation (1) is (A/2^R)*(Vp−Vn) when considered as analog values. Here, A=(Dpos−Dneg)/2. R is the resolution of the ΔΣ ADC 15. Therefore, (Equation 2) is (A/2^R=Rth/(Rth+Rref); finally, Rth=Rref*A/(2^R−A) (Equation 3).

Next, the reference voltages Va and Vb of the ΔΣ ADC 15 (DAC 26) will be considered. The reference voltages Va and Vb are preferably the same as reference voltages V1 and V2, respectively. This is because if there is a difference between the reference voltage Va (Vb) and the reference voltage V1 (V2), the difference is reflected in the output result of the ΔΣ ADC 15. Therefore, the reference voltage V1 is supplied to the reference voltage Va, and the reference voltage V2 is supplied to the reference voltage Vb. In this case, there is no problem in the positive conversion phase, but there is a problem in the negative conversion phase. This is because if the magnitude of the positive and negative reference voltage of DAC 26 is inverted (Va<Vb), the outputs of DAC 26 are inverted, and the operation of the analog-to-digital converter is failed. Therefore, in this embodiment, the issue is solved by inverting the output result of the 1-bit ADC 20 in the negative conversion phase. In accordance with an instruction from the first control circuit 24, the decoder 25 outputs the output of the 1-bit ADC 20 to DAC 26 as it is in the positive conversion phase, and inverts the output of the 1-bit DAC 20 to DAC 26 in the negative conversion phase.

As shown in FIG. 3, the output of the 1-bit ADC 20 is output from the output terminal O1 via the digital filter 22 and the interface circuit 23. The resistor Rth can be obtained by connecting the MCU (Micro Control Unit) 27 to the output terminal O1 and performing the calculation of Equation (3) by MCU 27. In order to simplify the signal processing, a sign of Dneg may be inverted. In this case, A=(Dpos+Dneg)/2.

Although the above description is a basic description of the operation of the semiconductor device 10, the semiconductor device 10 further has a pre-charge function. As described above, since the EMI-noise reducing capacitors C1 to C3 are coupled to the terminals I3 to I5 of the semiconductor device 10, a convergence time for the input signal Vin of the pre-buffer 14 to reach a desired voltage Vtgt is needed. Therefore, in the semiconductor device 10, in both of the positive conversion phase and the negative conversion phase, the convergence times are shortened by pre-charging the input signal Vin of the pre-buffer 14 prior to the analog-to-digital conversion.

Figure 5:
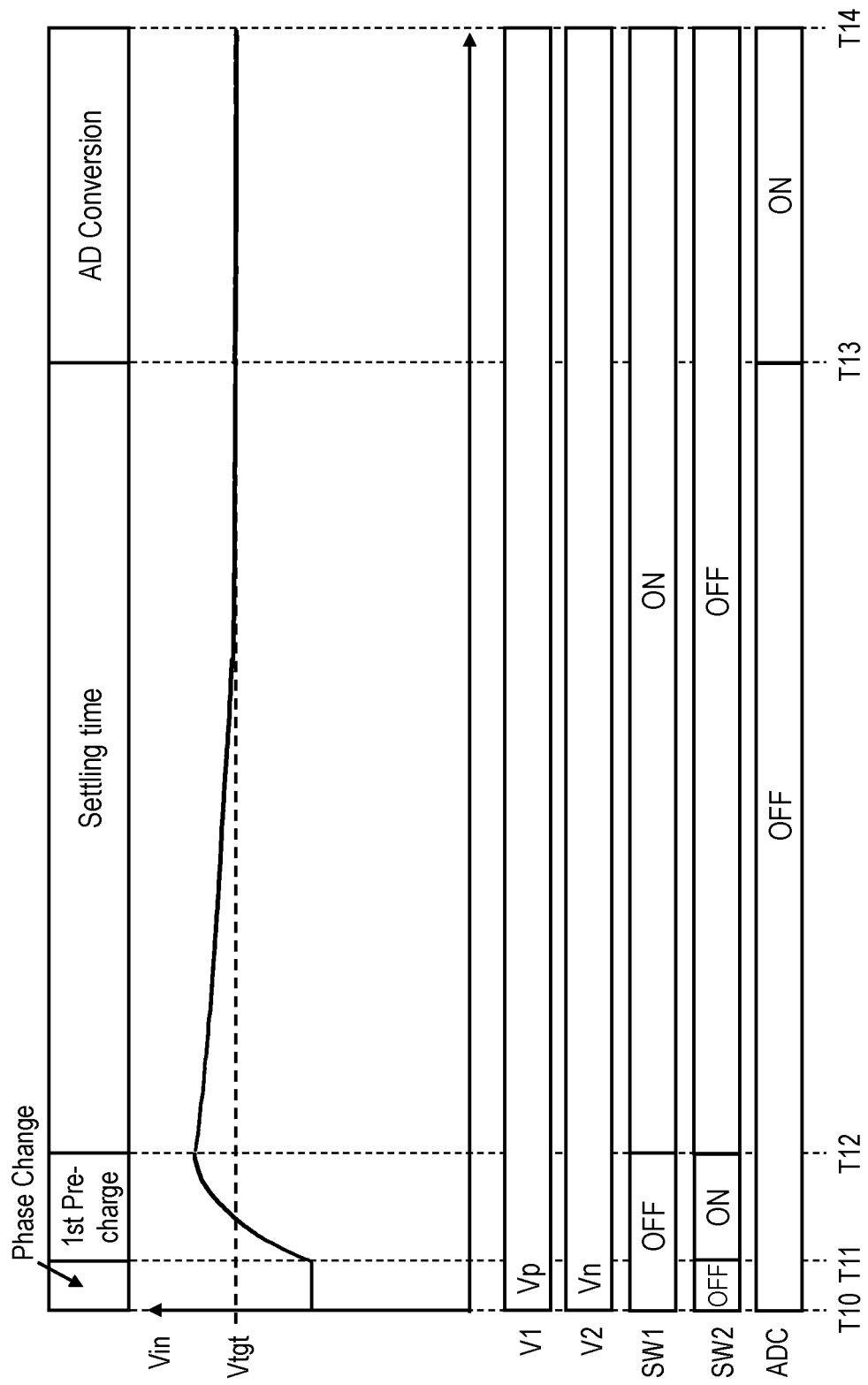
FIG. 5 is a timing chart for explaining the operation of the semiconductor device according to the first embodiment.

The pre-charging of the input signal Vin of the pre-buffer 14 is performed by using switches SW1 and SW2. FIG. 5 is a timing chart of the positive conversion phase. First, the high potential reference voltage Vp is set as the reference voltage V1, and the low potential reference voltage Vn is set as the reference voltage V2. The switches SW1 and SW2 are off (time T10).

Next, the semiconductor device 10 enters a pre-charge period (1st Pre-Charge) and the switch SW2 is turned on (time T11). When the switch SW2 is turned on, the operational amplifier 12 charges the input signal Vin of the pre-buffer 14 with the reference voltage V1.

Next, the semiconductor device 10 enters a settling time, the switch SW1 is turned on, and the switch SW2 is turned off (time T12). The input signal Vin of the pre-buffer 14 is settled by the voltage Vtgt obtained by dividing the potential difference between the reference voltage signals V1 and V2 by the resistors Rref and Rth (time T13).

Next, the semiconductor device 10 enters an analog-to-digital conversion period (AD Conversion), and the voltage Vtgt is subjected to analog-to-digital conversion by the ΔΣ ADC 15.

The switches SW1 and SW2 are controlled by the switch controller 17.

Figure 6:
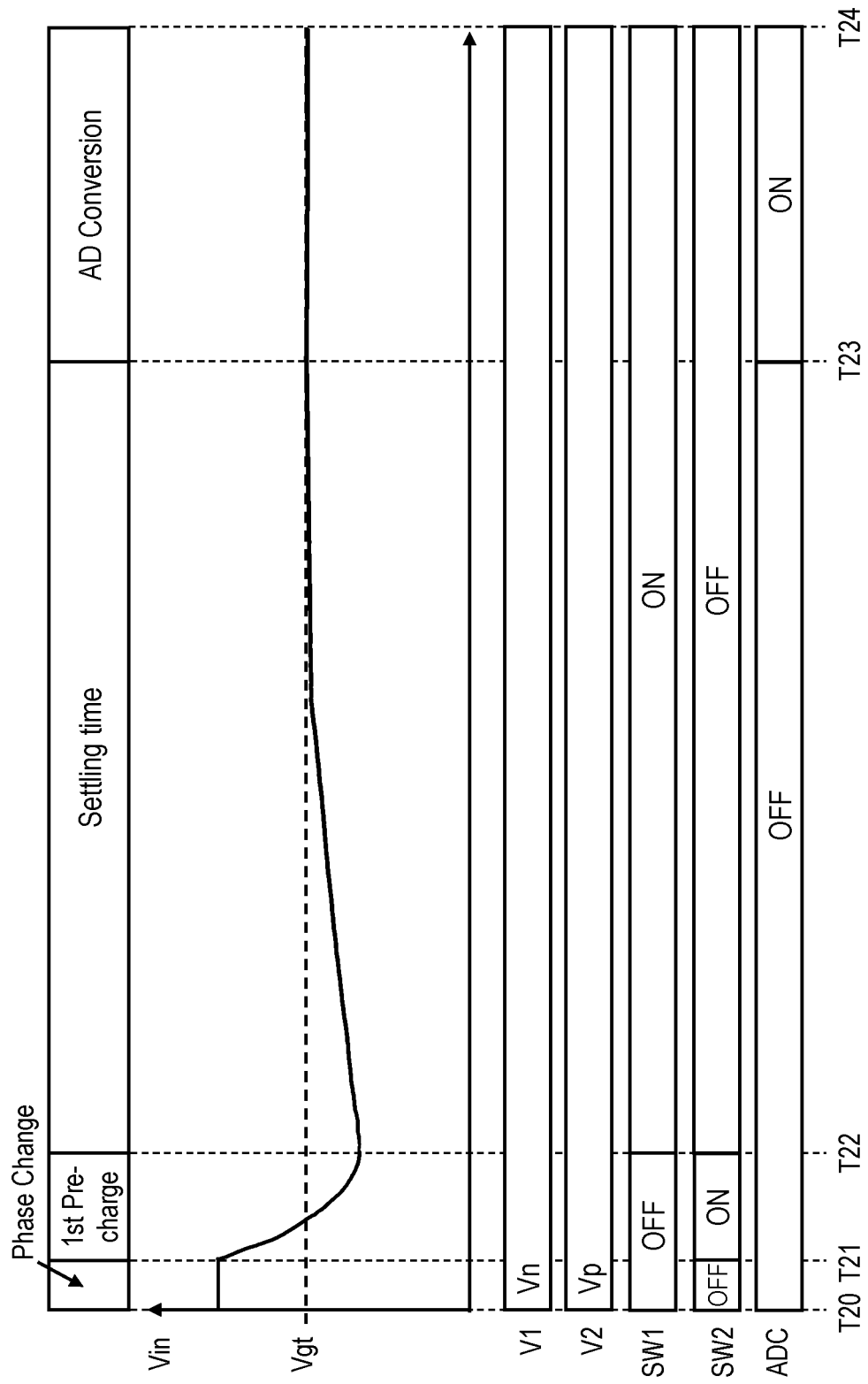
FIG. 6 is a timing chart for explaining the operation of the semiconductor device according to the first embodiment.

FIG. 6 is a timing chart of the negative conversion phase. The basic operation is the same as that of the positive conversion phase, and therefore description thereof is omitted.

As described above, the semiconductor device 10 further has a pre-charge function, thereby being able to perform analog-to-digital conversions for obtaining the resistance Rth at high speed.

Next, operations of the noise detector 16, the resistor R2, and the switch SW3, which are characteristics of the first embodiment, will be described. As described above, since the sensor resistor Rth and the terminal I3 are connected by the wire harness, there is a possibility that glow plug noise and injector noise are superimposed on the input signal Vin. These noises are attenuated by the RC filter (resistors R1, R2, capacitor C3), but the RC filter (time constant) affects the measured time of the resistor Rth. Therefore, in the first embodiment, the noise detector 16 is provided to increase the time constant of the RC filter when noise is detected, and to decrease the time constant of the RC filter when noise is not detected.

If the noise detector 16 does not detect noise, the switch SW3 is turned on. Since the resistor R2 is bypassed, the RC filter is composed of the resistor R1 and the capacitor C3 (time constant Tc1). When the noise detector 16 detects noise, the switch SW3 is turned off. The RC filter is composed of resistors R1 and R2 and a capacitor C3 (time constant Tc2). Therefore, it is Tc2>Tc1. The specific numerical values of Tc2 and Tc1 depend on the application. For example, Tc2 may be 150 to 200 times Tc1.

Figure 7:
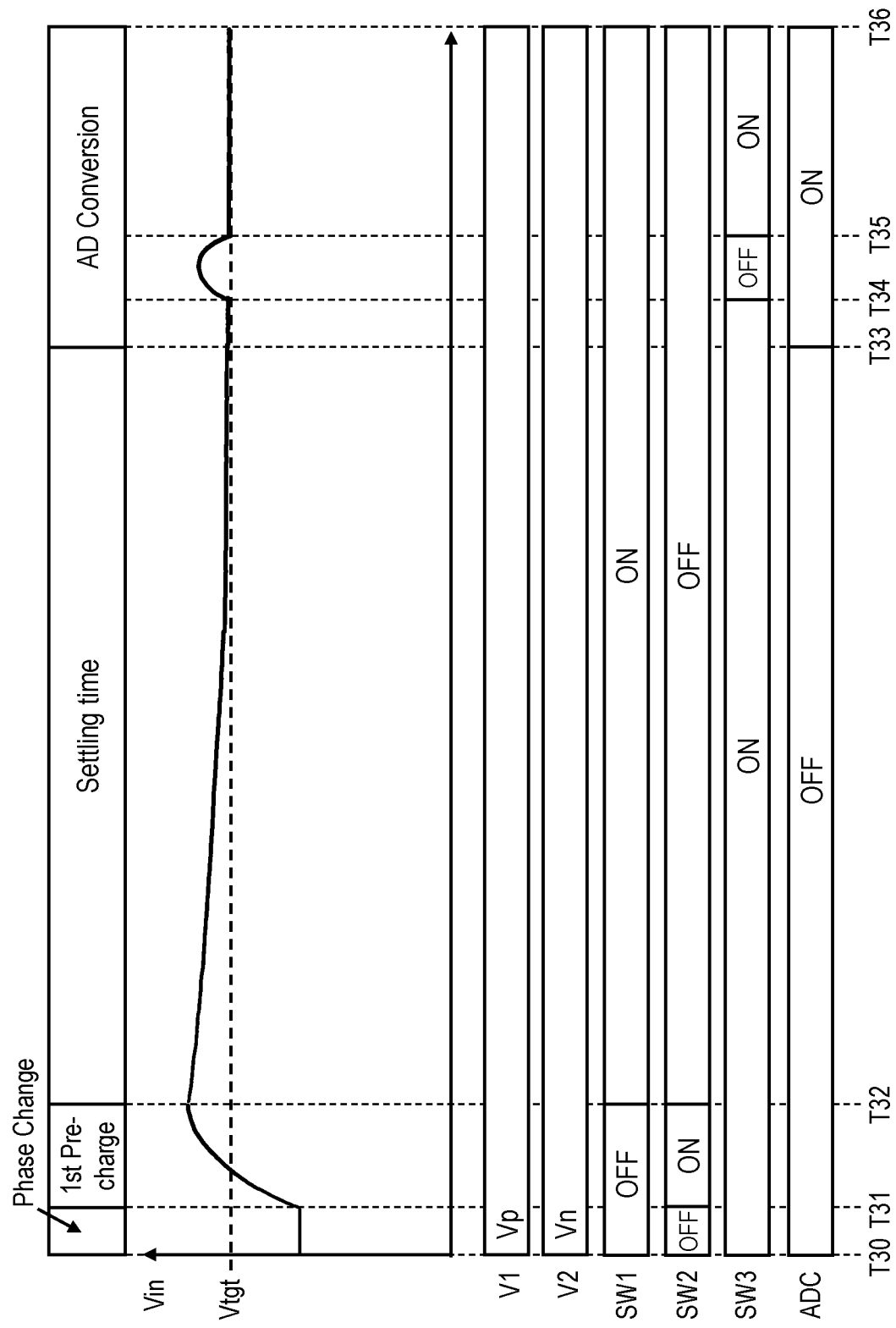
FIG. 7 is a timing chart for explaining the operation of the semiconductor device according to the first embodiment.

FIG. 7 is a timing chart showing the operation of the positive conversion phase. In FIG. 7, noise is superimposed on the analog-to-digital conversion period at times T34 to T35. The noise detector 16 turns off SW3 when it detects noise. A high-speed response performance is not required for the noise detector 16. This is because the RC filter composed of the resistor R1 and the capacitor C3 causes the propagation of the glow plug noise and the injector noise to have a time delay. Since the negative conversion phase is the same, the description thereof is omitted.

Figure 8:
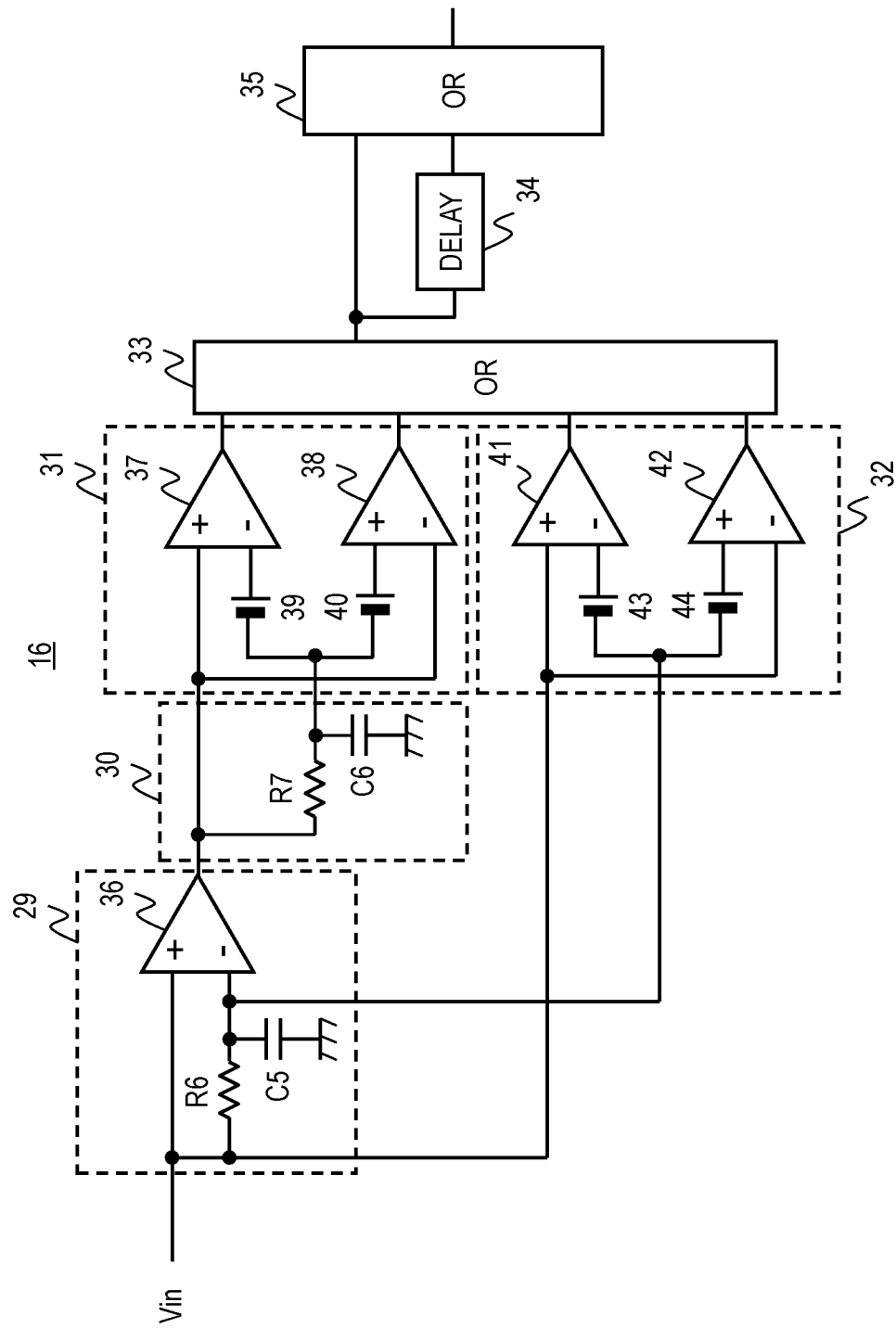
FIG. 8 is an example of the noise detector.

FIG. 8 shows an example of the noise detector 16. As shown in FIG. 8, the noise detector 16 includes an amplifier circuit 29, a first low-pass filter 30, a first window comparator 31, a second window comparator 32, an OR circuit 33, a delay circuit 34, and an OR circuit 35.

Now, injector noise and glow plug noise will be described. Generally, injector noise is known as noise having a high slew rate and a small amplitude. The glow plug noise is known as noise having a lower slew rate and a large amplitude. Thus, the noise detector 16 requires the ability to detect these noises. Therefore, in this first embodiment, the first window comparator 31 detects noise having a high slew rate and a small amplitude, and the second window comparator 32 detects noise having a lower slew rate and a large amplitude.

Returning to FIG. 8, the noise detector 16 will be further described. The amplifier circuit 29 is a circuit for amplifying an AC component of noise. The amplifier circuit 29 includes a second low-pass filter (R6 and C5) and an operational amplifier 36. A noise having a frequency higher than a predetermined frequency, that is a higher slew rate, is amplified by the amplifier circuit 29.

The first window comparator 31 has comparators 37 and 38 and DC offset voltages 39 and 40. The comparator 37 is for detecting the rise of noise, and the comparator 38 is for detecting the fall of noise. The output of amplifier circuit 29 is connected to the non-inverting input of comparator 37 and the inverting input of comparator 38. The output of the first low-pass filter 30 is connected to the inverting input of the comparator 37 via the offset voltage 39. The output of the first low-pass filter 30 is connected to the non-inverting input of the comparator 38 via the offset voltage 40.

The comparator 37 compares the output signal of the amplifier circuit 29 with a signal obtained by adding the DC offset voltage 39 to the output of the first low-pass filter 30. Therefore, the comparator 37 outputs Hi (high voltage) when noise having a predetermined frequency or higher, that is, a high slew rate is input. In addition, since the AC component of the noise is amplified by the amplifier circuit 29, it is also possible to detect noise having a small amplitude. The same applies to the comparator 38.

The second window comparator 32 has comparators 41 and 42 and DC offset voltages 43 and 44. Comparator 41 is for detecting the rise of noise, and comparator 42 is for detecting the fall of noise. The input signal Vin is connected to the non-inverting input of comparator 41 and the inverting input of comparator 42. The output of the second low-pass filter is connected to the inverting input of comparator 41 via the offset voltage 43. The output of the second low-pass filter is connected to the non-inverting input of comparator 42 via the offset voltage 44.

Comparator 41 compares the input signal Vin with a signal obtained by adding the DC offset voltage 43 to the output of the second low-pass filter. Therefore, compared with the comparator 37, comparator 41 outputs Hi when noise having a low frequency, that is, a low slew rate is input. Compared to comparator 37, comparator 41 detects noise having a large amplitude. The same applies to comparator 42.

OR circuit 33 outputs Hi when any of the comparators 37, 38, 41, and 42 detects noise.

Figure 9:
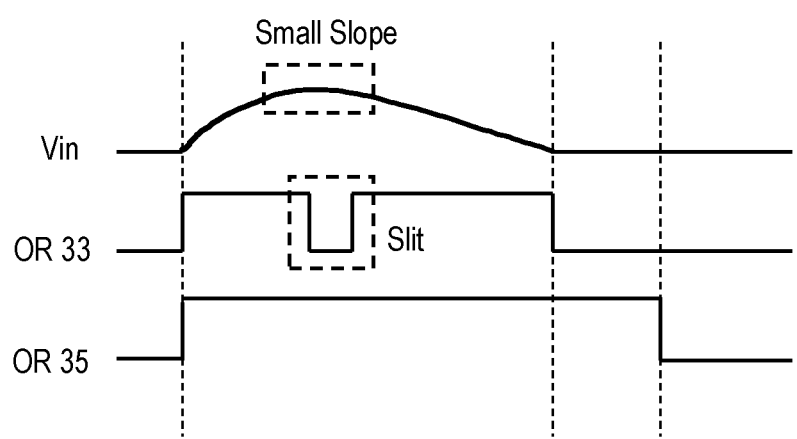
FIG. 9 is a waveform diagram for explaining the operation of the shaping circuit.

A shaping circuit for shaping the output waveform of OR circuit 33 is composed of the delay circuit 34 and OR circuit 35. FIG. 9 is an operation image diagram of the delay circuit 34 and OR circuit 35. When noise as shown in FIG. 9 enters the input signal Vin, the noise peak is a state in which the slew rate is partially lowered. Since this peak is not detected as noise in both of the window comparators 31 and 32, a slit is generated in the noise detection result. Therefore, by OR circuit 35, a logical OR is obtained between the noise detection result (the output of OR circuit 33) and an output obtained by adding a delay (delay circuit 34) to the noise detection result. As a result, as shown in FIG. 9, the noise detection result in which no slit occurs is obtained.

The switch SW3 is turned off when the noise detector 16 detects noise. The switch SW3 is turned on when the noise detector 16 does not detect noise.

As described above, in the semiconductor device 10 according to the first embodiment, when the noise detector 16 detects noise, the RC filter having a large time constant becomes valid. When the noise detector 16 does not detect noise the RC filter, having a small time constant, becomes valid. This makes it possible to achieve both the attenuation of the superimposed noise and the shortening of the sensor resistance value measurement time.

It is needless to say that first embodiment is not limited to the above-described embodiment, and various modifications can be made. For example, the resistor R2 may be a variable resistor. Alternatively, the resistors R1 and R2 may be a variable resistor. In this instance, the switch SW3 may increase the resistance value of the variable resistor when the noise detector 16 detects noise, and may decrease the resistance value of the variable resistor when the noise detector 16 does not detect noise.

The noise detector 16 includes two window comparators 31 and 32, but is not limited thereto. The noise detector 16 can be appropriately changed according to noise types to be superimposed. For example, three or more window comparators may be used. Alternatively, a low-pass filter may be simply used as long as it is sufficient to cope with noise of a specific frequency.

Second Embodiment

Figure 10:
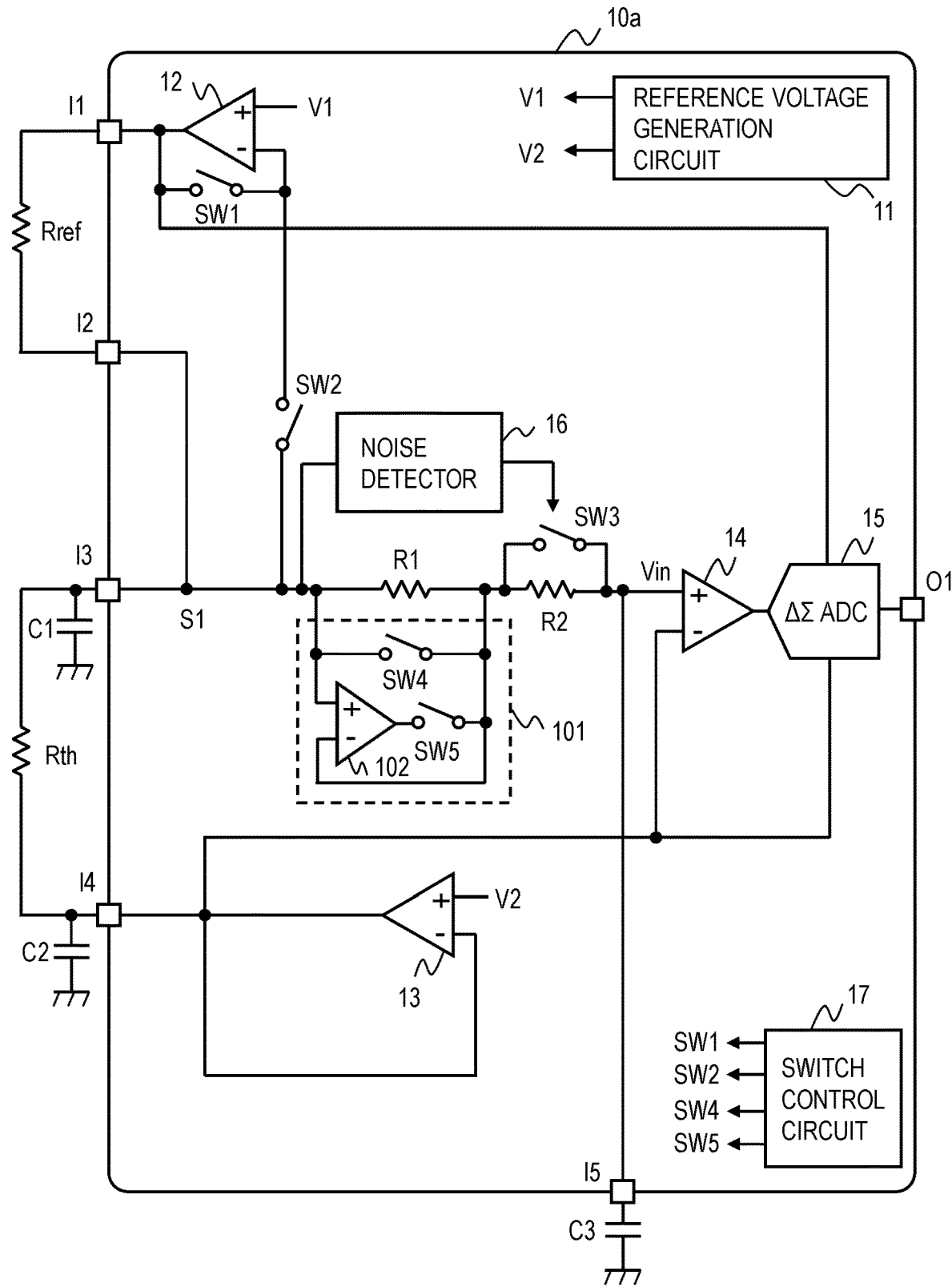
FIG. 10 is a diagram of a semiconductor device according to a second embodiment.

Next, a second embodiment will be described. FIG. 10 is a diagram showing a configuration of semiconductor device 10a according to the second embodiment. The difference from the first embodiment is that a bypassing circuit 101 is arranged at both ends of the resistor R1 in parallel. The bypass circuit 101 includes an operational amplifier 102 and a switches SW4, SW5. The by-pass circuit 101 is a circuit for performing the pre-charging described in first embodiment more efficiently.

Figure 11:
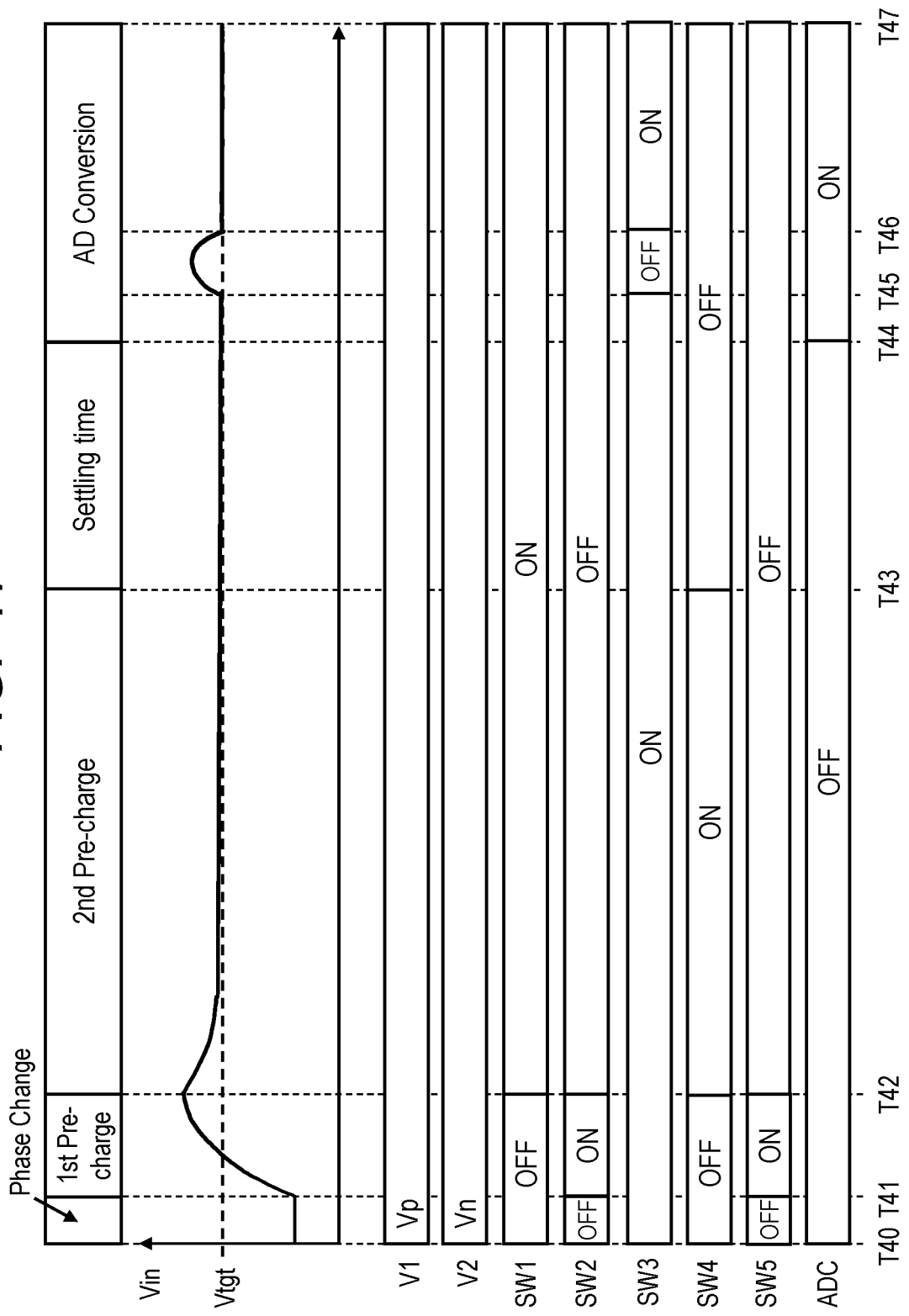
FIG. 11 is a timing chart for explaining the operation of the semiconductor device according to the second embodiment.

The operation of the semiconductor device 10a according to the second embodiment will be described with reference to FIG. 11. FIG. 11 is a timing chart of the positive conversion phase. In this second embodiment, a second pre-charge period (2nd Pre-charge) is added. First, the high potential reference voltage Vp is set as the reference voltage V1, and the low potential reference voltage Vn is set as the reference voltage V2. The switches SW1, SW2, SW4, SW5 are off and the switch SW3 is on at time T40.

Next, the semiconductor device 10a enters a first pre-charge period (1st Pre-Charge), and the switches SW2, SW5 are turned on (time T41). When the switches SW2, SW5 are turned on, the input signal Vin of the pre-buffer 14 is charged with the reference voltage V1 by the operational amplifiers 12 and 102. Since the output of the operational amplifier 12 is connected to the input signal V1 in the vicinity of the terminal 13, the operational amplifier 12 mainly contributes to the charging of the capacitors C1 and C2. Since the output of the operational amplifier 102 is connected to the input signal V1 in the vicinity of the terminal 15, the operational amplifier 102 mainly contributes to the charging of the capacitor C3.

Next, semiconductor device 10a enters a second pre-charge period (2nd Pre-Charge), the switches SW1, SW4 are turned on, and the switches SW2, SW5 are turned off (time T42). The input signal Vin is charged with a voltage Vtgt obtained by dividing the potential difference between the reference voltages V1 and V2 by resistors Rref and Rth. In the first embodiment, the input signal Vin is charged with the voltage Vtgt after the first pre-charge period. At this time, the resistor R1 becomes a factor to inhibit the charge of the input signal Vin. Therefore, in the second embodiment, the charging of the input signal Vin is promoted by bypassing the resistor R1 via switch SW4.

Next, semiconductor device 10a enters a settling period, and the switch SW4 is turned off at time T43. The input signal Vin is settled by the voltage Vgt at time T44.

Next, semiconductor device 10a enters the analog-to-digital conversion period, and an analog-to-digital conversion is performed on the voltage Vgt by the ΔΣA DC 15.

The operation when noises are detected during the analog-to-digital converter is the same as the first embodiment.

The switches SW1, SW2, SW4, SW5 are controlled by the switch controller 17.

Since the negative conversion phase is the same as the first embodiment, the description thereof is omitted.

As described above, in the semiconductor device 10a according to the second embodiment, the second pre-charge function is added. In addition to the effects of the first embodiment, this enables a further reduction in resistivity measurement time.

Third Embodiment

Figure 12:
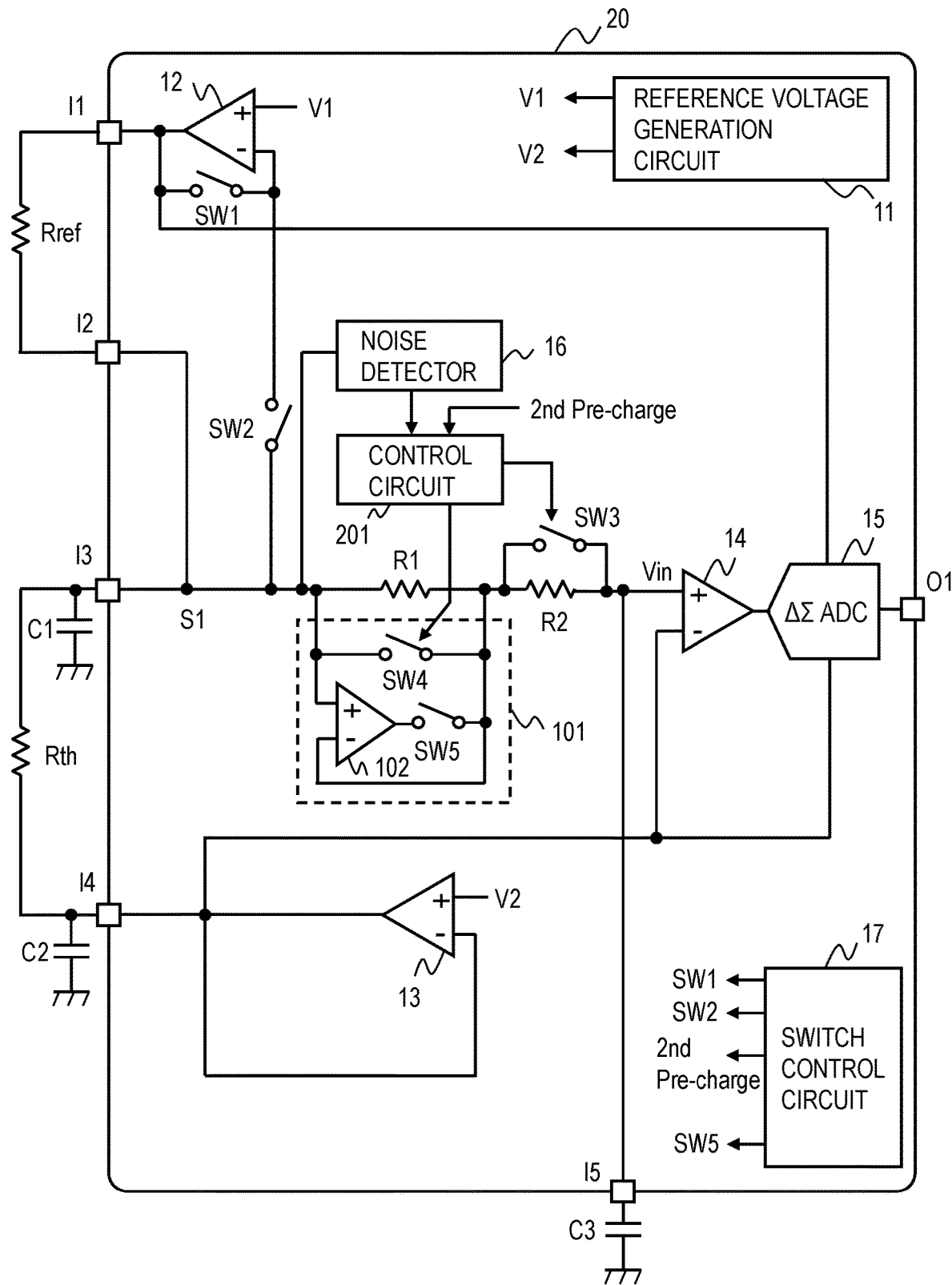
FIG. 12 is a diagram of a semiconductor device according to a third embodiment.

Next, a third embodiment will be described. FIG. 12 is a diagram showing a configuration of a semiconductor device 20 according to the third embodiment. The difference from the first and second embodiments is that a second control circuit 201 is added.

It is difficult to know when the noise superimposed on the input signal Vin will occur. It may also occur during the second pre-charge period described in the second embodiment. When noise is generated and converged within the second pre-charge period, the input signal Vin is charged by the voltage Vtgt after convergence of the noise. However, if a noise spanning before and after the second pre-charge is completed occurs, the noise voltage is held by the RC filter. Therefore, a result of the analog-to-digital conversion is affected by the noise. Therefore, in the third embodiment, when the noise is spanning before and after the end of the second pre-charge is detected, the control circuit 201 extends the second pre-charge period.

Figure 13:
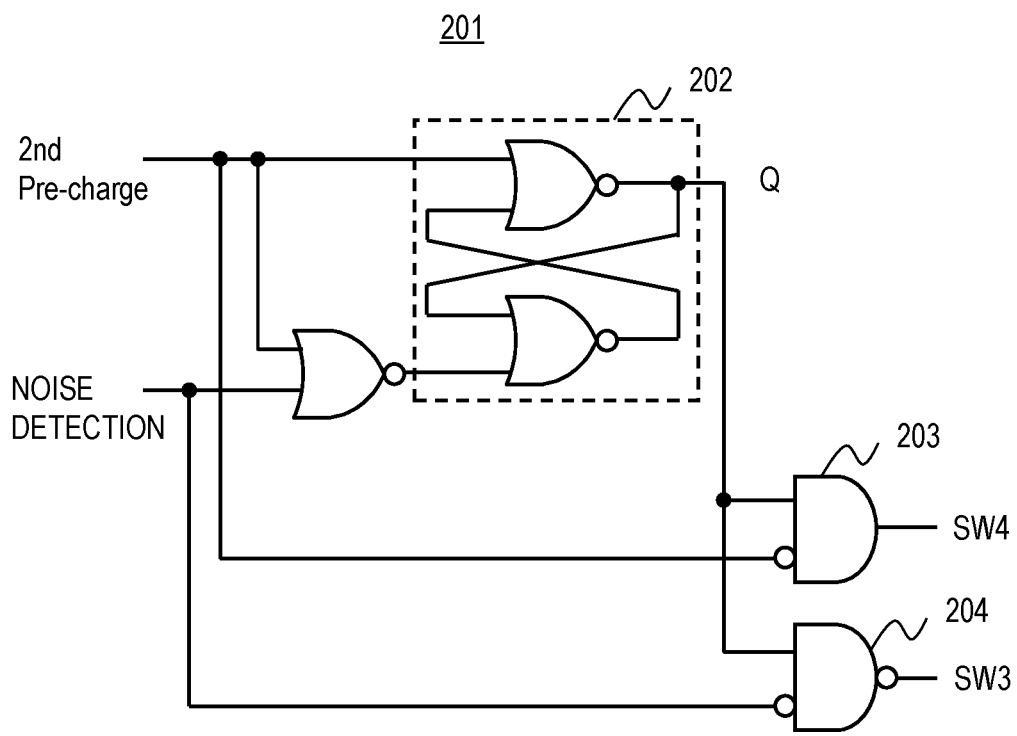
FIG. 13 shows an example of the control circuit.

FIG. 13 shows an example of the control circuit 201 and its truth table. Determining whether or not noise is detected during the second pre-charge period and stored in the RS flip-flop 202. The logical element 203 outputs a control signal of the switch SW4 based on the output of the RS flip-flop 202 and 2nd Pre-charge signal. The logic element 204 outputs a control signal for switch SW3 based on the output of the RS flip-flop 202 and the output of the noise detector 16. In FIGS. 12 and 13, the "2nd Pre-charge" signal corresponds to the control signal of switch SW4 in the second embodiment. The "NOISE DETECTION" signal is the output signal of the noise detector 16.

Next, the operation of the semiconductor device 20 according to the third embodiment will be described with reference to FIG. 14.

Figure 14:
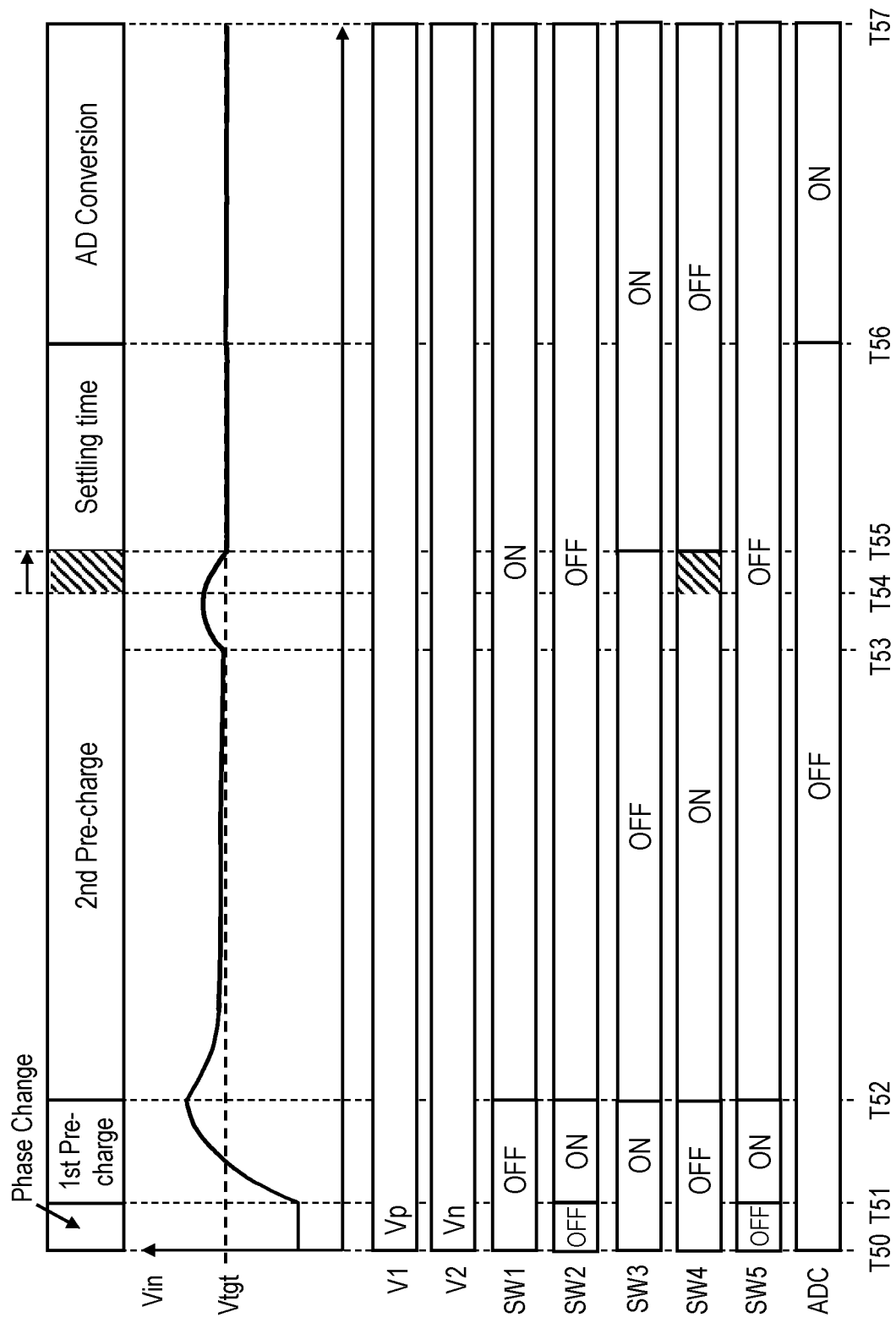
FIG. 14 is a timing chart for explaining the operation of the semiconductor device according to the third embodiment.

FIG. 14 is a timing chart of the positive conversion phase. As shown in FIG. 14, noise is generated (T53 to T54) across T54, which is the original second pre-charge period end timing. The control circuit 201 detects this noise and extends the second pre-charge period from time T54 to time T55 until the end of the noise.

Since the negative conversion phase is the same, the description thereof is omitted.

As described above, in the semiconductor device 20 according to the third embodiment, if noise spanning before and after end of the second pre-charge occurs, the second pre-charge duration is extended. In addition to the effects of first embodiment, this can prevent a resistive measurement accuracy from deteriorating.

Fourth Embodiment

Figure 15:
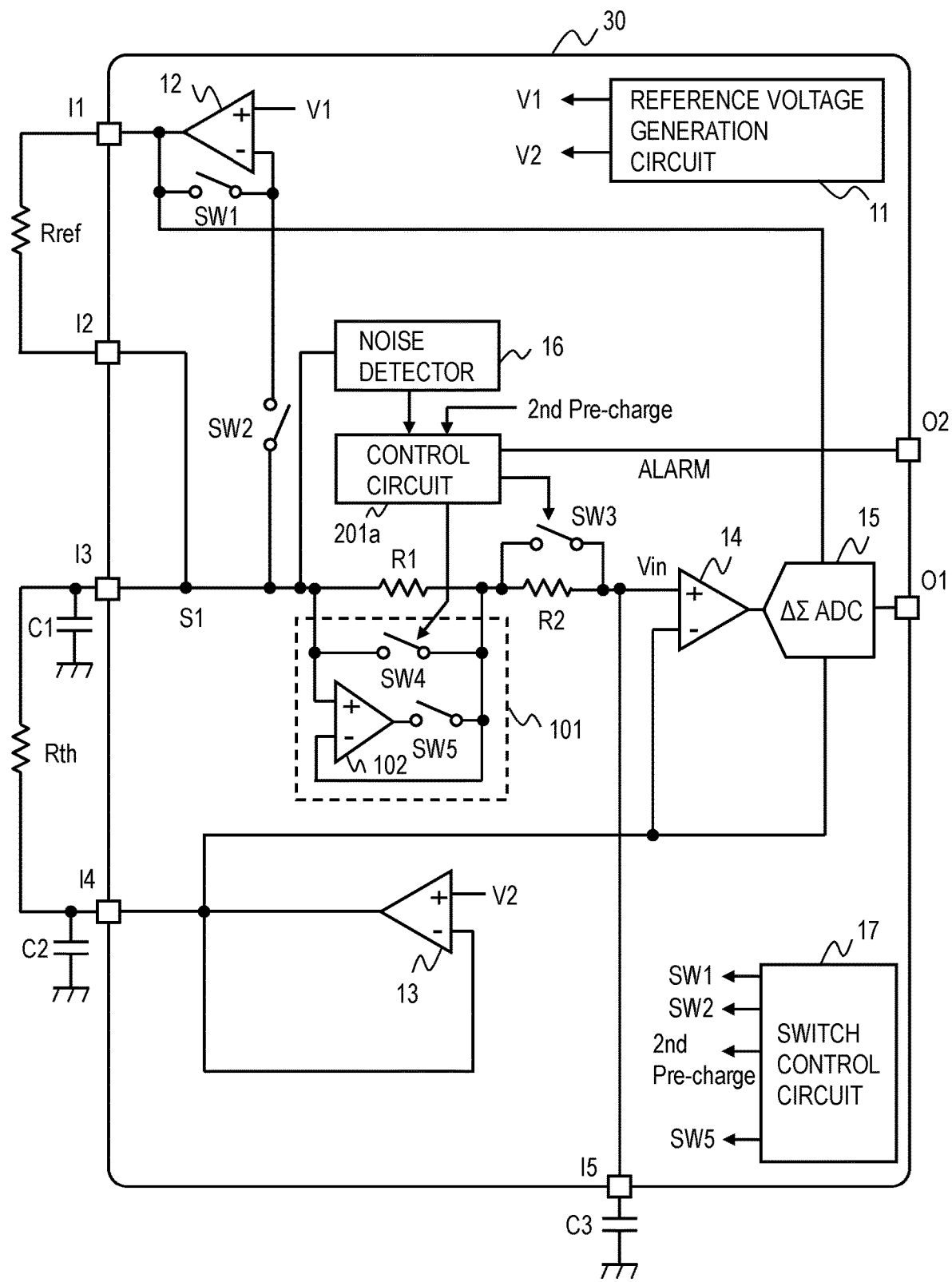
FIG. 15 is a diagram of a semiconductor device according to a fourth embodiment.

FIG. 15 is a diagram showing a configuration of a semiconductor device 30 according to a fourth embodiment. The difference from the third embodiment is that the second control circuit 201 is replaced with the control circuit 201a. The control circuit 201a has an alarm outputting function. The alarm output from the control circuit 201 is output to the outside via the output terminal O2 of the semiconductor device 30. For example, an MCU is connected to the output terminal O2.

Figure 16:
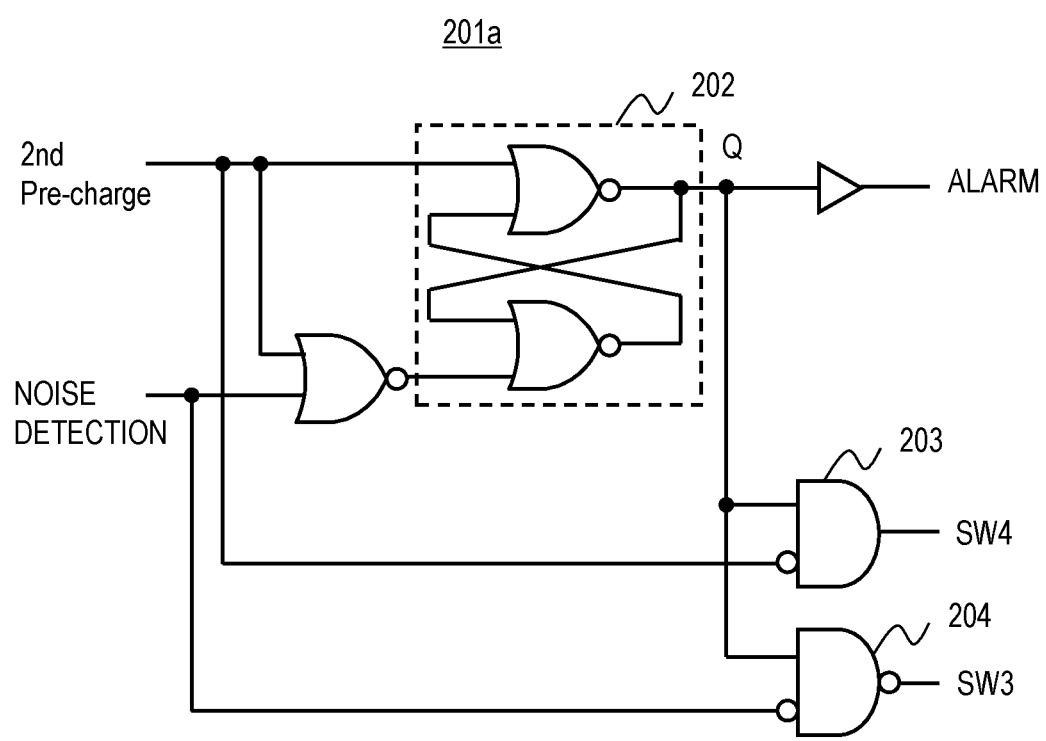
FIG. 16 shows an example of the control circuit.

FIG. 16 shows an example of the control circuit 201a. The control circuit 201a is a modified control circuit 201 to output the Q output of the RS flip-flop 202 as the alarm signal.

In the third embodiment, if noise spanning before and after end of the second pre-charge occurs, the second pre-charge period is extended. When the noise generation period is long, the second pre-charge period is also extended. If the analog-to-digital conversion is started at a fixed (periodic) timing, the extended second pre-charge period may overlap with the start of the analog-to-digital conversion. In this case, the result of the analog-to-digital conversion may be affected by the noise. Therefore, in the fourth embodiment, if the analog-to-digital conversion start timing and the second pre-charge period overlap, the analog-to-digital conversion result at that time is discarded (ignored).

Figure 17:
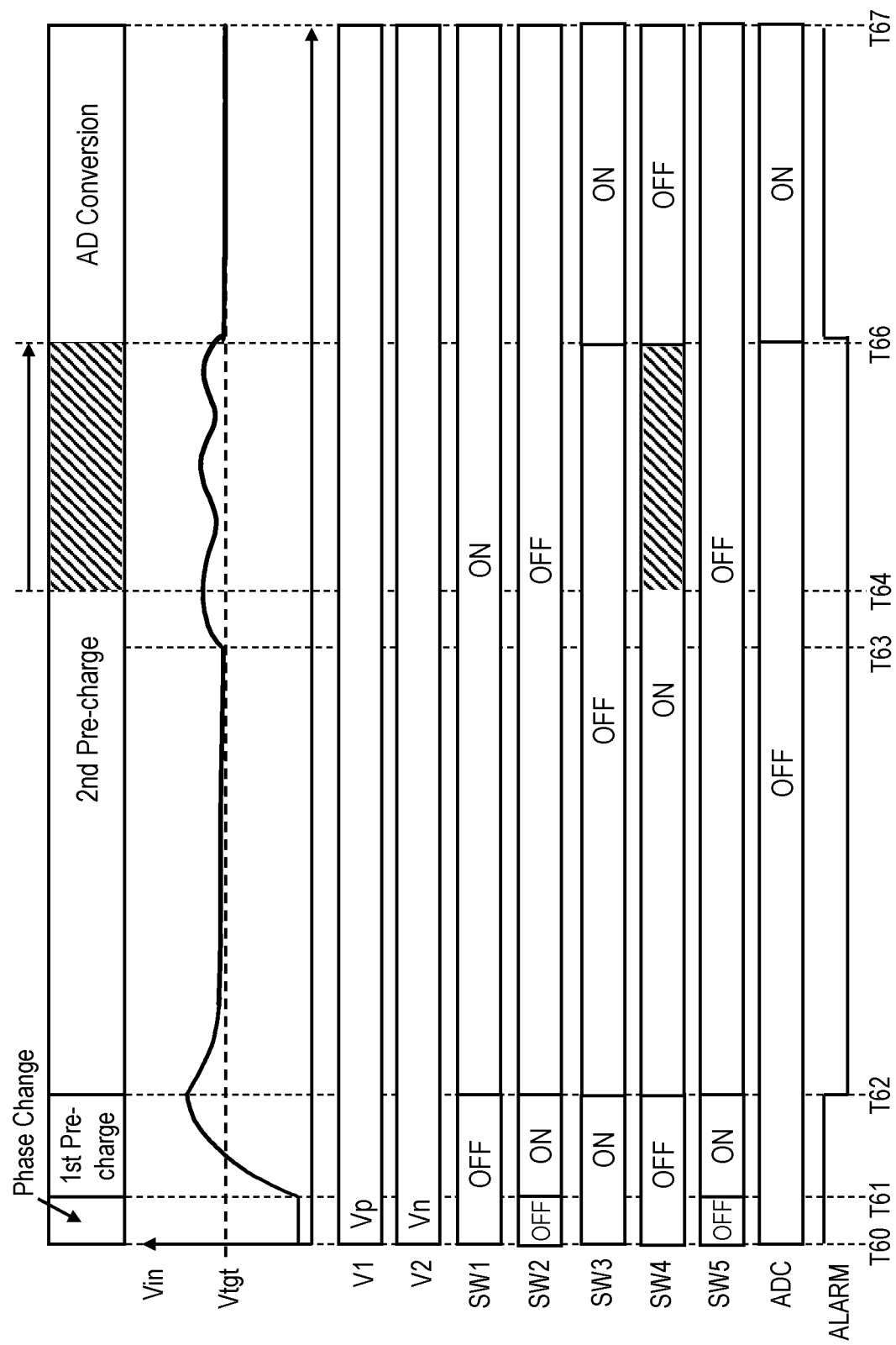
FIG. 17 is a timing chart for explaining the operation of the semiconductor device according to the fourth embodiment.

FIG. 17 is a timing chart in the case where noise spanning before and after end of the second pre-charge period is generated for a long time. Since noise is generated from time T63 to time T66, the second pre-charge is extended to time T66. However, the time T66 is the start timing of the analog-to-digital conversion. The control circuit 201a outputs a logical value 0 as an alarm signal (ALARM) during the extended second pre-charge period (times T62 to T66).

As described in the first embodiment, the result of the analog-to-digital conversion is transmitted to MCU 27 coupled to the output terminal O1. In this fourth embodiment, the alarm signal is also transmitted to MCU 27. When the alarm signal (Q signal) has a logical value of 0 at the starting timing (time T66) of the analog-to-digital conversion of the semiconductor device 30, MCU 27 discards the result of the analog-to-digital conversion at that time (times T66 to T67).

It is assumed that MCU 27 knows the starting time of the analog-to-digital conversion of the semiconductor device 30. This can be achieved if MCU 27 directs the initiation of the analog-to-digital conversions of the semiconductor device 30. Alternatively, the semiconductor device 30 may notify MCU 27 of the starting time of the analog-to-digital conversion. Here, MCU 27 may be a semiconductor device other than MCU as long as it is a semiconductor device capable of communicating with and controlling the semiconductor device 30.

The main application of the sensor resistance Rth is a temperature sensor, but the measurement of the temperature sensor, i.e. the measurement of the resistance value Rth, is performed periodically. For example, it is assumed that there are (n)-th, (n+1)-th, and (n+2)-th resistance value measurements, and the analog-to-digital conversion result is discarded at the time of the (n+1)-th resistance value measurement. This means that the (n+1)th measurement value (temperature) is the same as the (n)-th measurement value (temperature), but this is not a problem in an application in which a rapid temperature change (for example, on the order of several hundred milliseconds) is not assumed.

In the example described above, if the analog-to-digital conversion result is discarded even after the (n+2)-th time, the measurement value of the (n)-th time continues to be used. If this is not desirable, MCU 27 may capture the (n+2)-th measurement without discarding it.

Alternatively, the analog-to-digital conversion result may not be discarded, and MCU 27 may set a flag record that the conversion result is affected by noise.

As described above, in the fourth embodiment, when the extended second pre-charge period overlaps with the starting timing of the analog-to-digital conversion, an alarm is outputted. In addition to the effects of the first, second and third embodiments, reliability information can be added to the analog-to-digital result.

It should be noted that the present invention is not limited to the above-mentioned embodiments, and various modifications can be made without departing from the substance thereof.

What is claimed is:

1. A semiconductor device comprising:
a first terminal to which one end of a reference resistor is coupled;
a second terminal to which the other end of the reference resistor is coupled;
a third terminal to which one end of a sensor resistor and the second terminal is coupled;
a fourth terminal to which the other end of the sensor resistor is coupled;
a first buffer which supplies a first reference voltage to the first terminal;
a second buffer which supplies a second reference voltage to the fourth terminal;
a reference voltage generation circuit which supplies one of first and second voltages alternately in a time division manner as the first reference voltage and supplies the other as the second reference voltage;
a first analog-to-digital conversion circuit which performs analog-to-digital conversion on a signal line coupled to the third terminal;
an RC filter disposed on the signal line; and
a noise detector which detects noise of the signal line, wherein a time constant of the RC filter is changed based on a noise detection result of the noise detector.

2. The semiconductor device according to claim 1, wherein the RC filter includes a resistor coupled in series to the signal line and a switch coupled in parallel to the resistor, and
wherein the switch is controlled based on the noise detection result of the noise detector.

3. The semiconductor device according to claim 2, further comprising:
a fifth terminal,
wherein the RC filter comprises the resistor and a capacitor coupled to the fifth terminal.

4. The semiconductor device according to claim 3, wherein the resistor includes first and second resistors coupled in series, and
wherein the switch is coupled in parallel with the second resistor.

5. The semiconductor device according to claim 3, further comprising:
a pre-buffer placed between the resistor and the first analog-to-digital conversion circuit.

6. The semiconductor device according to claim 1, wherein the analog-to-digital conversion circuit is a delta-sigma analog-to-digital conversion circuit.

7. The semiconductor device according to claim 6, wherein the delta-sigma analog-to-digital conversion circuit includes:
a subtractor,
a loop filter,
a second analog-to-digital conversion circuit,
a digital-to-analog conversion circuit,
wherein the first reference voltage is supplied to a positive power supply of the digital-to-analog conversion circuit and the second reference voltage is supplied to a negative power supply of the digital-to-analog conversion circuit, and
wherein the digital-to-analog conversion circuit performs digital-to-analog conversion on an output or an inverted output of the second analog-to-digital conversion circuit based on the time division manner.

8. The semiconductor device according to claim 1, wherein the first buffer performs a first pre-charge on the signal line by the first reference voltage.

9. The semiconductor device according to claim 4, further comprising:
a bypass circuit coupled in parallel with the first resistor, wherein the bypass circuit performs a second pre-charge on the signal line by bypassing the first resistor.

10. The semiconductor device according to claim 9, wherein the bypass circuit includes an operational amplifier coupled in parallel with the first resistor,
wherein the operational amplifier is activated during the first pre-charge.

11. The semiconductor device according to claim 1, wherein the noise detector includes first and second window comparators.

12. The semiconductor device according to claim 11, wherein the noise detector further includes a shaping circuit which shapes output waveforms of the first and second window comparators.

13. The semiconductor device according to claim 12, wherein the noise detector further includes:
an amplifier circuit coupled to the signal line, and
a first low-pass filter coupled to the amplifier circuit,
wherein the amplifier circuit includes a second low-pass filter and an operational amplifier,
wherein a non-inverting input of the operational amplifier is coupled to the signal line, and an inverting input of the operational amplifier is coupled to the signal line via the second low-pass filter,
wherein the first window comparator compares an output of the amplifier circuit with an output of the first low-pass filter, and
wherein the second window comparator compares the signal line with an output of the second low-pass filter.

14. The semiconductor device according to claim 9, further comprising:
a control circuit which extends the second pre-charge period when noise spanning before and after end of the second pre-charge occurs.

15. The semiconductor device according to 14, wherein the control circuit outputs an alarm signal indicating that noise spanning before and after end of the second pre-charge occurs.

16. A resistance measurement system including a semiconductor device and a micro-controller, the semiconductor device comprising:
a first terminal to which one end of a reference resistor is coupled;
a second terminal to which the other end of the reference resistor is coupled;
a third terminal to which one end of a sensor resistor and the second terminal is coupled;
a fourth terminal to which the other end of the sensor resistor is coupled;
a first buffer which supplies a first reference voltage to the first terminal;
a second buffer which supplies a second reference voltage to the fourth terminal;
a reference voltage generation circuit which supplies one of first and second voltages alternately in a time division manner as the first reference voltage and supplies the other as the second reference voltage;

a first analog-to-digital conversion circuit which performs analog-to-digital conversion on a signal line coupled to the third terminal;

an RC filter disposed on the signal line; and a noise detector which detects noise of the signal line, wherein a time constant of the RC filter is changed based on a noise detection result of the noise detector, and wherein the micro-controller calculates a resistance of the sensor resistor from two conversion results which are obtained by the analog-to-digital conversion circuit by the time division manner.

17. The resistance measurement system according to claim 16, the semiconductor device further comprising:

a by-pass circuit, wherein the RC filter includes first and second resistors coupled in series to the signal line, and a switch which is coupled in parallel to the second resistor and is controlled based on a noise detecting result of the noise detector, wherein the first buffer performs a first pre-charge on the signal lines by the first reference voltage, and wherein the bypass circuit is coupled in parallel with the first resistor and performs a second pre-charge on the signal line by bypassing the first resistor.

18. The resistance measurement system according to claim 17, the semiconductor device further comprising:

a control circuit which extends the second pre-charge period and outputs an alarm signal to the micro-controller when noise spanning before and after end of the second pre-charge occurs.

19. The resistance measurement system according to claim 18, wherein the micro-controller discards a conversion result of the analog-to-digital conversion circuit from the semiconductor device when the micro-controller receives the alarm signal.

* * * * *